United States Patent
Sato et al.

(10) Patent No.: US 10,556,273 B2
(45) Date of Patent: Feb. 11, 2020

(54) SURFACE-COATED CUTTING TOOL HAVING EXCELLENT CHIPPING RESISTANCE AND WEAR RESISTANCE

(71) Applicant: MITSUBISHI MATERIALS CORPORATION, Tokyo (JP)

(72) Inventors: Shun Sato, Naka (JP); Masakuni Takahashi, Naka (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 266 days.

(21) Appl. No.: 15/529,008

(22) PCT Filed: Nov. 27, 2015

(86) PCT No.: PCT/JP2015/083407
§ 371 (c)(1),
(2) Date: May 23, 2017

(87) PCT Pub. No.: WO2016/084939
PCT Pub. Date: Jun. 2, 2016

(65) Prior Publication Data
US 2017/0266733 A1    Sep. 21, 2017

(30) Foreign Application Priority Data

Nov. 27, 2014  (JP) .................. 2014-239956
Nov. 25, 2015  (JP) .................. 2015-229736

(51) Int. Cl.
B23B 27/14    (2006.01)
B23B 51/00    (2006.01)
(Continued)

(52) U.S. Cl.
CPC ............. *B23B 27/148* (2013.01); *B23B 27/20* (2013.01); *B23B 51/00* (2013.01); *C04B 35/5831* (2013.01); *C23C 14/0647* (2013.01)

(58) Field of Classification Search
USPC .......... 51/307, 309; 428/216, 336, 697, 698, 428/699
See application file for complete search history.

(56) References Cited

U.S. PATENT DOCUMENTS 6,316,094 B1 * 11/2001 Fukaya ............... C04B 35/5831
                                                    428/699
7,150,925 B2 * 12/2006 Sato ....................... C23C 30/005
                                                    51/307
(Continued)

FOREIGN PATENT DOCUMENTS

CN    101031525 A    9/2007
CN    101678467 A    3/2010
(Continued)

OTHER PUBLICATIONS

Office Action dated Jul. 4, 2018 for the corresponding Chinese Patent Application No. 201580063713.5.
(Continued)

*Primary Examiner* — Archene A Turner
(74) *Attorney, Agent, or Firm* — Leason Ellis LLP

(57) ABSTRACT

In a surface-coated cutting tool, an A layer made of an $(Al_{1-x}Ti_x)N$ layer ($0.35 \leq x \leq 0.6$ by an atom ratio) and a B layer made of a $(Al_{1-y-z}Ti_ySi_z)N$ layer ($0.35 \leq y \leq 0.6$ and $0.01 \leq z \leq 0.1$ by an atom ratio) are layered on a surface of a tool body in which at least a cutting edge is made of a cBN sintered body. A layer thickness ratio of the A layer and the B layer ($t_B/t_A$) is 2 to 5, an X-ray diffraction intensity ratio $I(200)/I(111)$ as the entire hard coating layer is more than 3 and 12 or less, a full width at half maximum of a peak of $I(200)$ is 0.3 to 1.0, the $I_A(200)/I_A(111)$ of the A layer is 2 to 10, and a full width at half maximum of the peak of the $I_A(200)$ is 0.3 to 1.0.

4 Claims, 2 Drawing Sheets

(51) Int. Cl.
*B23B 27/20* (2006.01)
*C04B 35/5831* (2006.01)
*C23C 14/06* (2006.01)

(56) References Cited

U.S. PATENT DOCUMENTS

| | | | | |
|---|---|---|---|---|
| 8,304,098 B2* | 11/2012 | Kubota | ............... | C23C 14/0641 |
| | | | | 428/336 |
| 2006/0182998 A1* | 8/2006 | Okamura | ................ | B23B 27/04 |
| | | | | 428/698 |
| 2012/0114436 A1* | 5/2012 | Andersson | ............ | C04B 41/009 |
| | | | | 407/119 |
| 2012/0201615 A1* | 8/2012 | Ni | ........................ | C23C 14/0641 |
| | | | | 428/698 |
| 2013/0065081 A1* | 3/2013 | Ni | ........................ | C23C 28/042 |
| | | | | 428/660 |
| 2016/0017499 A1 | 1/2016 | Kikuchi | | |

FOREIGN PATENT DOCUMENTS

| | | | |
|---|---|---|---|
| CN | 102639268 A | | 8/2012 |
| JP | 63-145726 A | | 6/1988 |
| JP | 09-300106 | * | 11/1997 |
| JP | 2003-145313 A | | 5/2003 |
| JP | 2004-230515 | * | 8/2004 |
| JP | 2007-21650 | * | 2/2007 |
| JP | 2007-030100 | * | 2/2007 |
| JP | 2007-253271 | * | 10/2007 |
| JP | 2010-284788 A | | 12/2010 |
| JP | 2011-110653 A | | 6/2011 |
| JP | 2012-035379 | * | 2/2012 |
| JP | 2015-139868 | * | 8/2015 |
| JP | 2015-160259 A | | 9/2015 |
| WO | WO-2014/136755 A | | 9/2014 |

OTHER PUBLICATIONS

International Search Report dated Feb. 16, 2016 for the corresponding PCT Application No. PCT/JP2015/083407.

* cited by examiner

SURFACE-COATED CUTTING TOOL HAVING EXCELLENT CHIPPING RESISTANCE AND WEAR RESISTANCE

CROSS-REFERENCE TO RELATED PATENT APPLICATIONS

This application is a U.S. National Phase application under 35 U.S.C. § 371 of International Patent Application No. PCT/JP2015/083407, filed Nov. 27, 2015, and claims the benefit of Japanese Patent Applications No. 2014-239956, filed on Nov. 27, 2014, and No. 2015-229736, filed on Nov. 25, 2015, all of which are incorporated herein by reference in their entirety. The International application was published in Japanese on Jun. 2, 2016 as International Publication No. WO/2016/084939 under PCT Article 21(2).

FIELD OF THE INVENTION

The present invention relates to a surface-coated cutting tool (hereinafter, referred to as "coated tool") in which a hard coating layer has excellent chipping resistance and wear resistance. Specifically, the coated tool of the present invention is a coated tool in which the hard coating layer is coated on a body of which a cutting edge to be used in cutting is made of cubic boron nitride (hereinafter, described as "cBN"), and the coated tool of the present invention achieves excellent wear resistance for a long period of time without occurrence of chipping even in a case where the coated tool is used in high-speed cutting of alloy steel or the like.

BACKGROUND OF THE INVENTION

In general, examples of the coated tool include an insert, a drill or a miniature drill, and a solid type end mil. The insert is attached to a tip end portion of a holder in order to perform turning or planning of a work material, such as various types of steel or cast iron and the insert is used being freely attachable to and removable from the tip end portion. The drill or a miniature drill is used in drilling of the work material; and further, the solid type end mill is used in face milling, sloting, or shoulder milling of the work material. In addition, as the coated tool, an insert type end mill is known which is freely attachable to and removable from the tool body and the insert type end mill performs the cutting similar to the solid type end mill.

From the related art, as the coated tool, for example, a coated tool which uses a WC-based cemented carbide, TiCN-based cermet, and a cBN sintered body as a tool body, and in which a hard coating layer is formed thereon, is known, and various tools are suggested for improving the cutting performance.

For example, Japanese Unexamined Patent Application, First Publication No. 2003-145313 discloses a technology of performing physical vapor deposition with respect to a hard coating layer made of an Al—Ti—Si composite nitride layer via a crystalline orientation history layer made of a Ti—Al composite nitride layer, on a surface of a WC-based cemented carbide body or a TiCN-based cermet body. The crystalline orientation history layer is made of the Ti—Al composite nitride layer, (a) the crystalline orientation history layer has an average layer thickness of 0.05 to 0.5 μm, satisfies a compositional formula: $(Ti_{1-x}Al_x)N$ (wherein, X indicates 0.01 to 0.15 by an atom ratio), and further, indicates that the highest peak appears on a (200) plane in the measurement by an X-ray diffraction device that uses a Cu-Kα X-ray, and a full width at half maximum of the highest peak is 0.5 degrees or less by 2θ. The hard coated layer is made of the Al—Ti—Si composite nitride layer, (b) the hard coated layer has an average layer thickness of 2 to 10 μm, satisfies a compositional formula: $(Al_{1-(A+B)}Ti_A Si_B)N$ (wherein, A indicates 0.35 to 0.55 and B indicates 0.05 to 0.20) by an atom ratio, and further, indicates that the highest peak appears on a (200) plane in the measurement by an X-ray diffraction device that uses the Cu-Kα X-ray, and a full width at half maximum of the highest peak is 0.5 degrees or less by 2θ. Japanese Unexamined Patent Application, First Publication No. 2003-145313 suggests a technology of obtaining a cutting tool made of a surface-coated cemented carbide of which wear resistance of the hard coating layer in high-speed cutting is improved by forming the crystalline orientation history layer and the hard coating layer on the WC-based cemented carbide body or a TiCN-based cermet base body.

TECHNICAL PROBLEM

As proposed in Japanese Unexamined Patent Application, First Publication No. 2003-145313, the coated tool in which the surface of the WC-based cemented carbide body or the TiCN-based cermet body is coated with the hard coating layer of which a crystalline orientation is controlled and which is made of a nitride layer of Ti and Al (hereinafter, illustrated as "(Al,Ti)N") and a nitride layer of Al, Ti, and Si (hereinafter, hereinafter, illustrated as "(Al,Ti,Si)N"), achieves excellent wear resistance since the hardness thereof is high. However, on the other hand, the (Al,Ti,Si)N layer is fragile since strain of a crystal lattice increases by containing Si, or a bonding strength between body-(Al,Ti)N layer-(Al,Ti,Si)N layer is not sufficient in the coated tool.

Therefore, in a case of using the cBN sintered body as a tool body and using the coated tool in which the above nitride layer is formed on the tool body, chipping resistance is not sufficient under the high-speed cutting condition in which a high load exerts on a cutting edge, and thus, there is a problem in that a service life is suppressed at a short period of time.

Here, even in a case of using the coated tool in high-speed cutting, a coated tool which achieves excellent chipping resistance, excellent wear resistance, and excellent cutting performance over a long period of time is required.

SUMMARY OF THE INVENTION

Solution to Problem

The inventors have found the following knowledge after thorough investigation with respect to the structure of the hard coating layer that solves the problem.

In the case that the cBN sintered body is used as the tool body (hereinafter, referred to as "cBN body"), when depositing the hard coating layer made of the (Al,Ti,Si)N layer, for example, by using an arc ion plating device, on the surface of the cBN body, the (Al,Ti)N layer is coated between the cBN body and the (Al,Ti,Si)N layer. At this time, the inventors have found that it is possible to improve the chipping resistance in the high-speed cutting by using the (Al,Ti)N layer as a buffer layer which buffers the strain caused by a lattice mismatch between the cBN body and the (Al,Ti,Si)N layer.

Furthermore, in a case of forming the (Al,Ti,Si)N layer directly on the cBN body, in addition to the large strain of the lattice as the (Al,Ti,Si)N layer itself contains a Si component, the strain caused by the lattice mismatch between the cBN body and the (Al,Ti,Si)N layer is also applied, and it is difficult to control the orientation of the (Al,Ti,Si)N layer to a desirable value. However, the inventors have found that, by controlling the orientation of the (Al,Ti)N layer, it is also possible to control the orientation of the (Al,Ti,Si)N layer formed thereon, and accordingly, it is possible to obtain both of the chipping resistance and wear resistance.

The present invention is based on the above-described knowledge.

(1) A surface-coated cutting tool of the present invention includes a tool body in which at least a cutting edge is made of a cubic boron nitride sintered body and a hard coating layer which is deposited on the tool body, wherein, (a) the cubic boron nitride sintered body is made of cubic boron nitride particles, and a bonded phase which includes at least one or more components selected from a group consisting of nitride, carbide, carbonitride and boride of Ti, and nitride and oxide of Al, and inevitable impurities, (b) an average grain size of the cubic boron nitride particles is 0.5 to 4.0 µm, a volume ratio of the cubic boron nitride particles in total volume of the cubic boron nitride sintered body is 40 to 70% by volume, and further, an average grain size of the bonded phase is 1 m or less, (c) the hard coating layer consists of an A layer that coats a surface of the tool body and a B layer that coats a surface of the A layer, (d) the A layer satisfies $0.35 \leq x \leq 0.6$ by an atom ratio in a case where compositional formula is $(Al_{1-x}Ti_x)N$, and the B layer satisfies $0.35 \leq y \leq 0.6$ and $0.01 \leq z \leq 0.1$ by an atom ratio in a case where compositional formula is $(Al_{1-y-z}Ti_ySi_z)N$, (e) an average total layer thickness of the A layer and the B layer is 1.5 to 4.0 µm, and satisfies $2 \leq t_B/t_A \leq 5$ in a case where an average layer thickness of the A layer is $t_A$ and an average layer thickness of the B layer is $t_B$, and (f) in a case where X-ray diffraction is performed on the entire hard coating layer consisting of the A layer and the B layer, the entire hard coating layer has a rock salt type cubic crystal structure, and $3 < I(200)/I(111) \leq 12$ is satisfied when a diffraction peak intensity of a (200) plane of crystal grains that configure the hard coating layer is I(200) and a diffraction peak intensity of a (111) plane of crystal grains that configure the hard coating layer is I(111), and a full width at half maximum of a peak of I(200) is 0.3 to 1.0.

(2) In the surface-coated cutting tool according to (1), it is preferable that x which indicates a Ti content ratio of the A layer and y which indicates a Ti content ratio of the B layer satisfy a relationship of $|x-y| \leq 0.15$.

(3) In the surface-coated cutting tool according to (1) or (2), it is preferable that, in a case where the X-ray diffraction is performed on the A layer, when the diffraction peak intensity of the (200) plane is $I_A(200)$ and the diffraction peak intensity of the (111) plane is $I_A(111)$, $2 < I_A(200)/I_A(111) \leq 10$ is satisfied, and a full width at half maximum of a peak of $I_A(200)$ is 0.3 to 1.0.

Advantageous Effects of Invention

In the surface-coated cutting tool of the present invention (hereinafter, referred to as "coated cBN-tool") in which the nitride is deposited, the hard coating layer is formed by coating the A layer having a predetermined composition satisfying the formula $(Al_{1-x}Ti_x)N$ and the B layer having a predetermined composition satisfying the formula $(Al_{1-y-z}Ti_ySi_z)N$ as a layered structure in an order of the A layer and the B layer, on the surface of the tool body in which at least the cutting edge is made of the cBN sintered body. In the present invention, further, by defining a layer thickness ratio $t_B/t_A$ of the A layer and the B layer to be 2 to 5, by defining the X-ray diffraction intensity ratio I(200)/I(111) on the entire hard coating layer to be more than 3 and 12 or less, and by defining the full width at half maximum of the peak of I(200) to be 0.3 to 1.0, the A layer functions as a buffer layer between the cBN body and the B layer, the orientation of the B layer is also controlled by controlling the orientation of the A layer, and the hard coating layer having a predetermined orientation on the entire hard coating layer is obtained. In the high-speed cutting process, such as alloy steel, in which a high load exerts on the cutting edge, the coated cBN-tool having the hard coating layer of the present invention achieves excellent chipping resistance and excellent wear resistance at the same time, and achieves excellent cutting performance over a long period of use.

DETAILED DESCRIPTION OF THE INVENTION

One embodiment of a coated cBN-tool of the present invention will be described hereinafter in detail.

Figure 1:
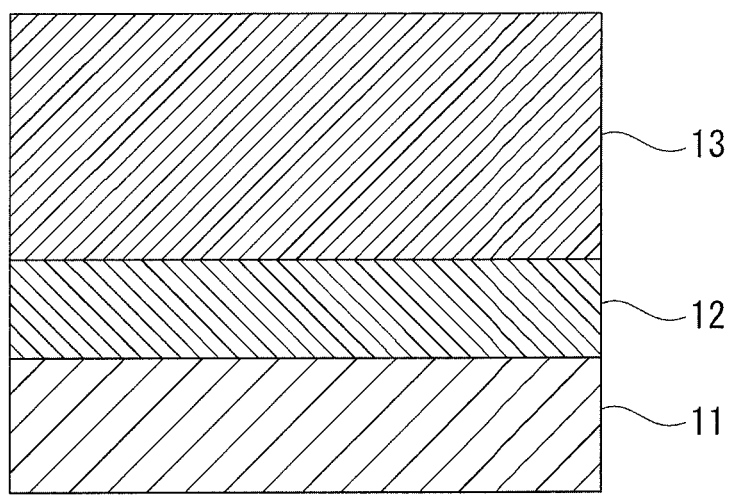
FIG. 1 is a schematic cross sectional view of a hard coating layer of a coated tool of the present invention.

As illustrated in FIG. 1, the coated cBN-tool of the present embodiment is deposited a hard coating layer consisting of an A layer 12 and a B layer 13 on a tool body (cBN body) 11 made of a cBN sintered body.

Average Grain Size of cBN Particles in cBN Sintered Body:

In the cBN sintered body, it is possible to suppress occurrence of chipping in which the cBN particles of a cutting edge fall off while the tool is in use, since fine and hard cubic boron nitride particles (hereinafter, referred to as "cBN particles") disperse in the cBN sintered body.

In addition, since the fine cBN particles in the cBN sintered body plays a role of dispersing and mitigating propagation of cracks which are developed from an interface between the cBN particles and a bonded phase and which are exerted by a stress applied to the cutting edge while the tool is in use, or cracks which develop from the cBN particles crack, excellent fracture resistance can be achieved.

However, when the average grain size of the cBN particles is less than 0.5 µm, a function of the cBN particles as hard particles cannot be sufficiently achieved since the grain size is excessively fine. When the average grain size exceeds 4.0 µm, there is a concern that the chipping is caused from the cBN particles fall off.

Therefore, the average grain size of the cBN particles is defined to be 0.5 to 4.0 µm.

Here, regarding the average grain size of the cBN particles, after forming the cBN sintered body, a sectional structure of the cBN sintered body is observed by using a scanning electron microscopy (SEM) and an energy dispersive X-ray spectroscopy (EDS), thereby a part of the cBN particles in the observation region is specified. Then, the part of the cBN particles in an observed image is extracted by image treatment, and an average value of diameters of the cBN particles in one image is obtained by shaping into a substantially circular shape having an equivalent area to set the diameter of the approximated circle to be diameters of each of the cBN particles. An average of the average values, which is obtained by at least three images, is defined as the average grain size (μm) of cBN. The observation region to be used in image treatment is defined by performing preliminary observation, but considering that the average grain size of the cBN particles is 0.5 to 4.0 μm, it is desirable that a visual field region is approximately 15 μm×15 μm.

Volume Ratio of cBN Particles in cBN Sintered Body:

When the volume ratio of the cBN particles in total volume of the cBN sintered body is less than 40% by volume, the volume of the hard material is small in the sintered body, the hardness of the cBN sintered body deteriorates, and thus, the wear resistance deteriorates. When the volume ratio exceeds 70% by volume, the bonded phase is not sufficient, and thus, a void which becomes a starting point of cracks is exerted in the sintered body, and the fracture resistance deteriorates. Therefore, the volume ratio of the cBN particles in the total volume of the cBN sintered body is defined to be within a range of 40 to 70% by volume.

Here, in a measurement method of the volume ratio (% by volume) of the cBN particles in total volume of the cBN sintered body, a secondary electronic image is obtained by observing the sectional structure of the cBN sintered body using the SEM, and a part of the cBN particles in the secondary electronic image is extracted by image treatment. Then, an area of the cBN particles in an entire area of the cBN sintered body in the observation region is calculated by the image analysis, and an average value of values, which is obtained by performing treatments with respect to at least three images, is defined as the volume ratio (% by volume) of the cBN particles. Considering that the average grain size of the cBN particles is 0.5 to 4.0 μm, the observation region to be used in the image treatment is desirably a visual field region which is approximately 15 μm×15 μm.

Bonded Phase:

A main hard component in the cBN sintered body in the present embodiment is the cBN particles having the above-described average grain size and the volume ratio. But, at least one or more particle components selected from a group consisting of nitride, carbide, carbonitride and boride of Ti and nitride and oxide of Al, which is already well known, can be used as the component which forms the bonded phase.

However, when the average grain size of the bonded phase exceeds 1 μm, since the number of voids increases when mixing raw material powder, pores are likely to remain in the sintered body during sintering, the fracture resistance deteriorates, and thus, the average grain size of the bonded phase is set to be 1 μm or less. A lower limit value of the average grain size of the bonded phase is not particularly limited, but is preferably 0.1 μm or more.

The average grain size of the bonded phase is obtained by the same method as that of the average grain size of the cBN particles.

"A Layer" which Configures Hard Coating Layer:

In the A layer which has a composition expressed by a compositional formula: $(Al_{1-x}Ti_x)N$, a content ratio x (here, x is an atom ratio) of Ti in the total amount of Ti and Al satisfies $0.35 \leq x \leq 0.6$.

When the content amount x of the Ti component is less than 0.35, strain of the crystal structure increases. Therefore, it is not possible to maintain a rock salt type crystal structure, and it becomes difficult to control the orientation. Furthermore, when the content amount x of the Ti component exceeds 0.6, hardness deteriorates and oxidation resistance becomes insufficient; thereby the content amount x of the Ti component is defined to be 0.35 to 0.6.

"B Layer" which Configures Hard Coating Layer:

In the B layer which has a composition expressed by a compositional formula: $(Al_{1-y-z}Ti_ySi_z)N$, content ratios y and z (here, y and z are atom ratios) of Ti and Si in the total amount of Ti, Al, Si respectively satisfy $0.35 \leq y \leq 0.6$ and $0.01 \leq z \leq 0.1$.

When the above condition is satisfied, the $(Al_{1-y-z}Ti_ySi_z)N$ layer which configures the B layer achieves desirable oxidation resistance and high wear resistance during the high-speed cutting such as a high temperature is generated during a cutting.

When the content ratio y of the Ti component is less than 0.35, the strain of the crystal structure increases. Therefore, it is not possible to maintain the rock salt type crystal structure, and it becomes difficult to control the orientation. When the content amount y of the Ti component exceeds 0.6, hardness deteriorates and oxidation resistance becomes insufficient.

In addition, when the content ratio z of the Si component is less than 0.01, the desirable wear resistance is not achieved, and when the content ratio z exceeds 0.1, strain of a crystal lattice increases and the fracture resistance deteriorates.

Therefore, the content ratio y of the Ti component is defined to be 0.35 to 0.6, and the content ratio z of the Si component is defined to be 0.01 to 0.1.

In addition, when the A layer acts as a buffer layer between the body and the B layer, it is preferable that the content ratios of Ti in metal components of the A layer and the B layer are close to each other, and 0.15 or less ($|x-y| \leq 0.15$) of the absolute value of the difference between the content ratios x and y can be indicated as a preferable value range. The range of the absolute value of the difference between x and y is more preferably $|x-y| \leq 0.10$. When the absolute value of the difference between x and y exceeds 0.10, the fracture resistance tends to deteriorate.

Average Total Layer Thickness of Hard Coating Layer:

A hard coating layer of the present embodiment is configured as a layered structure consisting of the $(Al_{1-x}Ti_x)N$ layer (here, $0.35 \leq x \leq 0.6$ by an atom ratio) which is the A layer immediately on the tool body, and the $(Al_{1-y-z}Ti_ySi_z)N$ layer (here, $0.35 \leq y \leq 0.6$ and $0.01 \leq z \leq 0.1$ by an atom ratio) which is the B layer formed thereon.

In the hard coating layer, high strength and toughness are ensured by the Ti component contained in the A layer, the Al component improves high-temperature hardness and heat resistance, and an effect of improving high-temperature oxidation resistance is exhibited in a state where Al and Ti exist together and are contained at the same time. Furthermore, the $(Al_{1-x}Ti_x)N$ layer has high hardness since the layer has rock salt type crystal structure (rock salt type cubic), it is possible to improve wear resistance by forming the A layer on the tool body.

The B layer is a layer which contains the Si component in the A layer, and has the rock salt type crystal structure (rock salt type cubic). In addition, the B layer is a layer in which the heat resistance is further improved by containing the Si component in the A layer. Since the B layer has a high oxidation start temperature and a high-temperature oxidation resistance, by forming the B layer, the wear resistance during the high-speed cutting such as a high temperature is generated during a cutting is improved.

The hard coating layer having the layered structure consisting of the A layer and the B layer cannot achieve sufficient wear resistance over a long period of use when the average total layer thickness is less than 1.5 μm; and since the hard coating layer is likely to break down when the average total layer thickness exceeds 4.0 μm; thereby the average total layer thickness of the hard coating layer is defined to be 1.5 to 4.0 μm.

Furthermore, in a case where the average layer thickness of the A layer is $t_A$ and the average layer thickness of the B layer is $t_B$, in the layered structure, when $t_B/t_A$ is less than 2, the B layer becomes relatively thin, accordingly, it is not possible to obtain sufficient wear resistance. When the value of $t_B/t_A$ exceeds 5, the thickness of the A layer becomes relatively thin, accordingly, it is not possible to exhibit the function as the buffer layer to buffer the strain of the B layer caused by a lattice mismatch between the bodies and the A layer, and it is not possible to sufficiently control the orientation of the B layer. Accordingly, the value of the $t_B/t_A$ is set to be 2 to 5. The value of $t_B/t_A$ is more preferably 3 to 5.

In addition, the layer thickness of the hard coating layer is the thickness of the layer in a direction perpendicular to the surface of the tool body, and the surface of the tool body is indicated by a reference line for roughness on a interface between of the body and the hard coating layer in an observation image of the section view perpendicular to the surface direction of the surface which is in contact with the hard coating layer of the body.

The composition of the A layer expressed by the compositional formula: $(Al_{1-x}Ti_x)N$ and the composition of the B layer expressed by the compositional formula: $(Al_{1-y-z}Ti_ySi_z)N$, are respectively average compositions of the A layer and the B layer.

In addition, the average compositions of the A layer and the B layer, the average layer thickness $t_A$, the average layer thickness $t_B$, and the average total layer thickness of the hard coating layer are obtained by measuring a longitudinal section of the hard coating layer perpendicular to the surfaces of the tool body by the section measurement using a scanning electron microscopy (SEM), a transmission electron microscope (TEM), and a energy dispersive X-ray spectroscopy (EDS).

Specifically, the average values of the measurement at each of five locations which are measured by the section measurement, are the average compositions of the A layer and the B layer, the average layer thickness $t_A$, the average layer thickness $t_B$, and the average total layer thickness of the hard coating layer.

X-Ray Diffraction with Respect to Entire Hard Coating Layer:

In the present embodiment, by controlling the orientation of the A layer, the desirable orientation is maintained in the B layer.

Figure 2A:
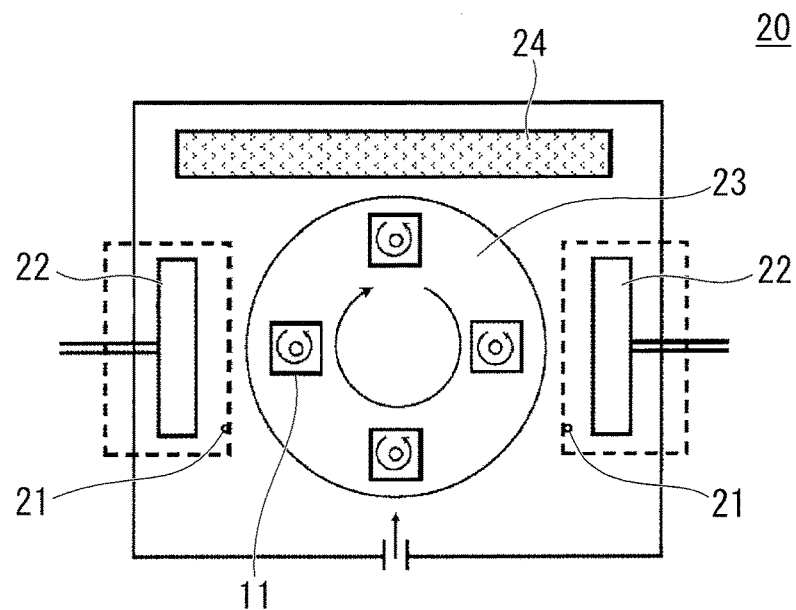
FIG. 2A is a schematic view and a plan view of an arc ion plating device for depositing the hard coating layer.
Figure 2B:
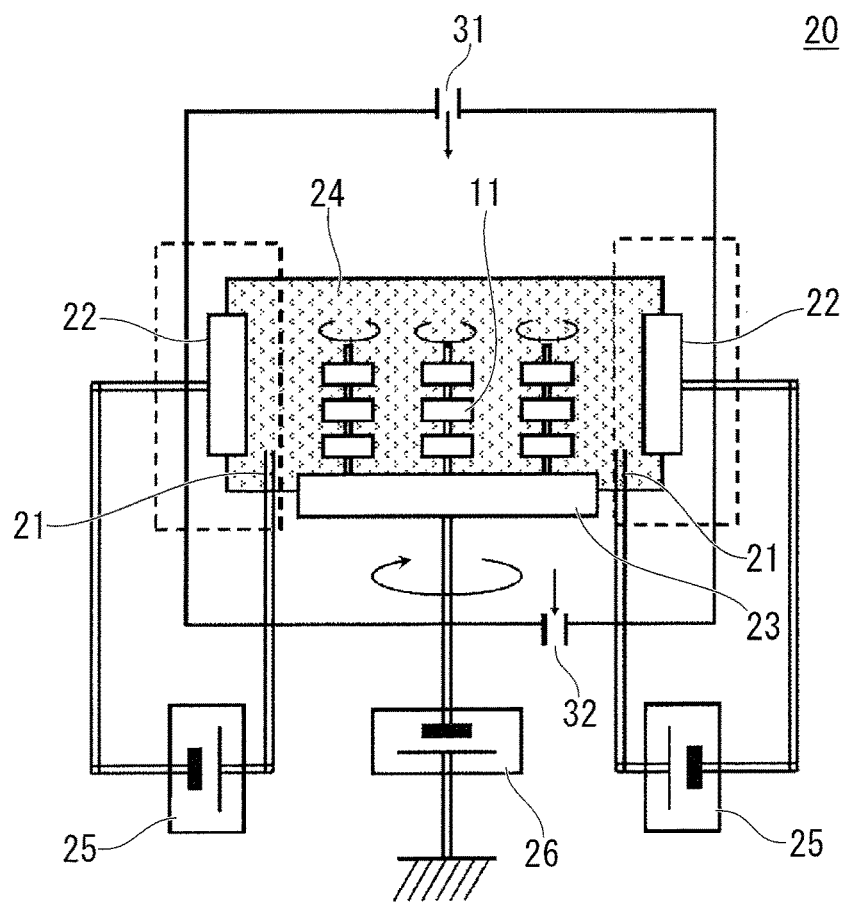
FIG. 2B is a schematic view and a side view of the arc ion plating device for depositing the hard coating layer.

In other words, in the present embodiment, it is possible to control the orientation, since the rate of the crystal growth and the diffusion rate of atoms is adjusted by controlling an arc current value a nitrogen gas partial pressure while the nitrogen gas is used as a reactant gas, a bias voltage, and a film forming temperature during the arc ion plating when the hard coating layer consisting of the A layer and the B layer is formed by using an arc ion plating device 20 illustrated in FIGS. 2A and 2B. By relatively slowly growing the crystal, a (200) plane of which surface energy is smaller than that of a (111) plane is oriented to be parallel to the surface of the tool body in the rock salt type cubic structure. Since the A layer and the B layer have the same rock salt type cubic structure, it is possible to arrange the align orientation of the A layer and the B layer when the B layer is formed on the upper layer of the A layer, of which the orientation is controlled as described above, by similarly controlling film forming parameters.

In addition, the X-ray diffraction is performed in the entire hard coating layer, and in a case where the diffraction peak intensity of the (200) plane is I(200) and the diffraction peak intensity of the (111) plane is I(111), when the value of I(200)/I(111) is 3 or less, the chipping resistance deteriorates since the orientation of the (111) plane which is a close-packed plane is strong, and meanwhile, when the value of I(200)/I(111) exceeds 12, the wear resistance deteriorates since the orientation of (200) becomes extremely strong.

Therefore, in order to achieve both of the high chipping resistance and wear resistance, it is necessary to set the value of I(200)/I(111) to be more than 3 and 12 or less. The value of the I(200)/I(111) is preferably 4 to 10.

In addition, when the full width at half maximum of the peak intensity I(200) of the (200) plane is less than 0.3, the crystal grain is likely to be coarsened, and thus, the chipping resistance deteriorates, and meanwhile, when the full width at half maximum exceeds 1.0, it is not possible to control the desirable orientation, or the strain of the crystal structure is large, thereby stable performance cannot be achieved.

Therefore, the full width at half maximum of I(200) should be 0.3 to 1.0. The full width at half maximum of I(200) is preferably 0.4 to 0.8.

X-Ray Diffraction with Respect to "a Layer":

In the entire hard coating layer, the value of I(200)/I(111) is more than 3 and 12 or less, and further, the full width at half maximum of the peak of I(200) is 0.3 to 1.0 as described above. Further, when the hard coating layer having these features, it is preferable to satisfy $2<I_A(200)/I_A(111)≤10$ in a case of performing the X-ray diffraction to the A layer, and it is desirable that the full width at half maximum of the peak of the $I_A(200)$ is 0.3 to 1.0.

Here, $I_A(200)$ and $I_A(111)$ respectively indicate the diffraction peak intensity of the (200) plane in the A layer and the diffraction peak intensity of the (111) plane in the A layer. The value of $I_A(200)/I_A(111)$ is more preferably 3 to 8, the full width at half maximum of the peak of the $I_A(200)$ is more preferably 0.4 to 0.8.

By forming the A layer as described above, the orientation of the B layer formed thereon is controlled, and as a result, the hard coating layer, in which 3<I(200)/I(111)<12 is satisfied in the entire hard coating layer and the full width at half maximum of the peak of I(200) is 0.3 to 1.0, tends to be easily formed.

In addition, a peak intensity ratio I(200)/I(111) with respect to the entire hard coating layer indicates a value of I(200)/I(111) calculated by using the overlapping diffraction peak intensity of the (200) plane as I(200) and the overlapping diffraction peak intensity of the (111) plane as I(111), considering the overlapping diffraction peak of the A layer and the B layer as one diffraction peak. In addition, after processing and removing the B layer by a method, such as a focused ion beam (FIB) method, it is possible to measure the diffraction peak intensity $I_A(200)$ and $I_A(111)$ of the A layer by using the above-described X-ray diffraction method.

Next, the coated tool of the present invention will be described in more detail using Example.

EXAMPLE

Making Step of Tool Body:

As raw material powder, cBN particles having an average grain size of 1 to 4 μm were prepared as raw material powder for forming a hard phase; and TiN powder, TiC powder, TiCN powder, Al powder, AlN powder, and Al$_2$O$_3$ powder were prepared as raw material powder for forming a bonded phase.

Mixing was performed at mixing ratios shown in Table 1 such that the content ratio of the cBN particles raw material became 40 to 70% by volume, when the total amount of several types of raw material powder and the cBN particles among these was 100% by volume.

Next, after wet-blending the raw material powder for 72 hours using a ball mill and drying the mixture, press molding of the mixture to obtain a compact having a diameter: 50 mm×thickness: 1.5 mm at a compacting pressure of 100 MPa, and then, the compact was held at a predetermined temperature within a range of 900° C. to 1300° C. and was temporarily sintered in a vacuum atmosphere having a pressure of 1 Pa or less, and after this, the cBN sintered body was made by inserting the compact into an ultra-high pressure sintering device and sintering the compact at a predetermined temperature at a pressure of 5 GPa within a temperature range of 1200° C. to 1400° C.

A sintered body having a predetermined size was formed by cutting the cBN sintered body using a wire electric discharge machine; the sintered body was brazed to a brazing portion (corner portion) of an insert main body made of a WC-based cemented carbide having a composition in which Co was 5% by weight, TaC was 5% by weight, and remainder was WC and having a shape of an insert of ISO standard CNGA120408, by using an Ag-based brazing material having a composition in which Cu was 26% % by weight, Ti was 5% % by weight, and the remainder was Ag; and cBN tool body 1 to 3 having a shape of an insert of ISO standard CNGA120408 were manufactured by performing a polishing treatment and a honing treatment to upper and lower surfaces thereof and outer circumference thereof.

TABLE 1

| Type of tool body | Mixing composition (% by volume) | | | | | | Average grain size of cBN particles | Average grain size of bonded phase |
|---|---|---|---|---|---|---|---|---|
| | TiN | TiCN | Al | AlN | Al$_2$O$_3$ | cBN | | |
| 1 | — | 24 | 32 | — | 4 | 40 | 1.2 | 0.7 |
| 2 | 32 | — | 16 | — | 2 | 50 | 2.4 | 0.2 |
| 3 | 18 | — | 11 | 1 | — | 70 | 3.3 | 0.4 |

Forming Step of Hard Coating Layer:

The hard coating layer was formed on the tool bodies 1 to 3 by using the arc ion plating device 20 illustrated in FIGS. 2A and 2B.

In addition, as an Al—Ti alloy target 22 of FIGS. 2A and 2B, the plurality of Al—Ti alloy targets 22 having different compositions were loaded in the device in accordance with a target composition of the (Al,Ti)N layer.

(a) In a state of being ultrasonic-cleaned in acetone and being dried, the tool bodies 1 to 3 were arranged on a rotary table 23 in the arc ion plating device 20; the arranged portion of the bodies 1 to 3 was along an outer circumferential portion at a position separated from a center axis on a rotary table 23 by a predetermined distance in a radial direction (tool body 11 of FIGS. 2A and 2B). In addition, as a cathode electrode (vapor source), the Al—Ti alloy target 22 having a predetermined composition was arranged.

(b) First, while exhausting air in the device and holding the inside in a vacuum state at $10^{-2}$ Pa or less, the inside of the device was heated to 500° C. by a heater 24, and then the pressure was set to be an Ar gas atmosphere of 0.5 to 2.0 Pa. Further, a DC bias voltage of −200 to −1000 V was applied to the tool body 11 which rotates while revolving on the rotary table 23, and bombardment treatment was performed to the surface of the tool body for 5 to 30 minutes by argon ions.

(c) Next, film formation of the A layer was performed as follows.

A predetermined reaction atmosphere within a range of 2 to 10 Pa shown in Table 2 was achieved by introducing nitrogen gas as the reaction gas in the device at the same time that the temperature in the device was maintained as shown in Table 2; and then arc discharge was generated by applying a predetermined DC bias voltage within a range of −25 to −75 V shown in Table 2 to the tool body 11 which rotates while revolving on the rotary table 23, and by allowing a predetermined current within a range of 80 to 120 A shown in Table 2 to flow between the cathode electrode (vapor source) made of the Al—Ti alloy target 22 having the predetermined composition and an anode electrode 21 for a predetermined time at the same time; and the A layer consisting of the (Al,Ti)N layer having a target composition shown in Table 4 and a target average layer thickness was deposited on the surface of the tool body 11 (A layer 12 of FIG. 1).

(d) Next, the forming step of the B layer was performed as follows.

First, a predetermined reaction atmosphere within a range of 2 to 10 Pa shown in Table 2 was achieved by introducing nitrogen gas as the reaction gas in the device at the same time that the temperature in the device was maintained as shown in Table 2; and then arc discharge was generated by applying a predetermined DC bias voltage within a range of −25 to −75 V shown in Table 2 to the tool body 11 which rotates while revolving on the rotary table 23, and by allowing a predetermined current within a range of 80 to 120 A shown in Table 2 to flow between the cathode electrode (vapor source) made of the Al—Ti alloy target 22 and the anode electrode 21; and the B layer consisting of the (Ti,Al)N layer having a target composition shown in Table 4 and a target average layer thickness was deposited on the surface of the A layer (B layer 13 of FIG. 1).

According to the above-described (a) to (d), the coated cBN-tools (hereinafter, referred to as "tool of the present example") 1 to 10 of the present example shown in Table 4 in which the hard coating layer deposited by layering the A layer and the B layer, were produced.

For comparison experiment, a lower layer and an upper layer were formed on the tool bodies 1 to 3 by depositing under the condition shown in Table 3, and then the coated tools (hereinafter, referred to as "tool of comparative example") 1 to 12 of comparative examples shown in Table 5 were produced.

In addition, since the lower layer and the upper layer of the tool of comparative examples were respectively layers which correspond to the A layer and the B layer of the present invention, hereinafter, the lower layers and the upper layers of the tools of comparative examples were respectively the A layers and the B layers for convenience.

TABLE 2

| | | Type of tool body | Hard coating layer forming condition | | | | | | | |
|---|---|---|---|---|---|---|---|---|---|---|
| | | | A layer | | | | B layer | | | |
| Type | | | $N_2$ gas pressure (Pa) | DC bias voltage (V) | Arc current (A) | Temperature in Device (° C.) | $N_2$ gas pressure (Pa) | DC bias voltage (V) | Arc current (A) | Temperature in Device (° C.) |
| Tool of present example | 1 | 1 | 8.0 | −50 | 100 | 500 | 6.0 | −50 | 120 | 500 |
| | 2 | 2 | 6.0 | −40 | 90 | 450 | 10.0 | −25 | 100 | 450 |
| | 3 | 3 | 10.0 | −25 | 80 | 500 | 10.0 | −40 | 80 | 500 |
| | 4 | 1 | 4.0 | −40 | 120 | 450 | 8.0 | −25 | 80 | 450 |
| | 5 | 2 | 2.0 | −75 | 110 | 400 | 2.0 | −75 | 100 | 400 |
| | 6 | 3 | 4.0 | −50 | 100 | 400 | 6.0 | −40 | 110 | 400 |
| | 7 | 1 | 4.0 | −30 | 100 | 450 | 6.0 | −40 | 110 | 450 |
| | 8 | 2 | 4.0 | −60 | 120 | 400 | 4.0 | −60 | 100 | 400 |
| | 9 | 3 | 10.0 | −40 | 90 | 500 | 9.0 | −40 | 90 | 500 |
| | 10 | 1 | 2.0 | −75 | 120 | 400 | 7.0 | −60 | 115 | 400 |

TABLE 3

| | | Type of tool body | Hard coating layer forming condition | | | | | | | |
|---|---|---|---|---|---|---|---|---|---|---|
| | | | A layer | | | | B layer | | | |
| Type | | | $N_2$ gas pressure (Pa) | DC bias voltage (V) | Arc current (A) | Temperature in Device (° C.) | $N_2$ gas pressure (Pa) | DC bias voltage (V) | Arc current (A) | Temperature in Device (° C.) |
| Tool of comparative example | 1 | 1 | 6.0 | −40 | 110 | 450 | 4.0 | −75 | 160 | 450 |
| | 2 | 2 | 2.0 | −10 | 140 | 350 | 2.0 | −75 | 180 | 350 |
| | 3 | 3 | 8.0 | −40 | 100 | 500 | 8.0 | −100 | 90 | 500 |
| | 4 | 1 | 10.0 | −50 | 80 | 550 | 2.0 | −100 | 100 | 550 |
| | 5 | 2 | 2.0 | −75 | 160 | 350 | 10.0 | −25 | 180 | 350 |
| | 6 | 3 | 10.0 | −25 | 180 | 400 | 4.0 | −50 | 160 | 400 |
| | 7 | 1 | 5.0 | −40 | 120 | 450 | 6.0 | −50 | 120 | 450 |
| | 8 | 2 | 8.0 | −25 | 100 | 450 | 10.0 | −40 | 90 | 450 |
| | 9 | 3 | 8.0 | −50 | 100 | 550 | 10.0 | −10 | 90 | 550 |
| | 10 | 1 | 6.0 | −25 | 110 | 400 | 4.0 | −100 | 160 | 400 |
| | 11 | 2 | 2.0 | −75 | 100 | 450 | 8.0 | −25 | 180 | 450 |
| | 12 | 3 | 10.0 | −40 | 110 | 500 | 10.0 | −100 | 90 | 500 |

Regarding a longitudinal section of the hard coating layer perpendicular to the surfaces of the tool body of the tools of the present example 1 to 10 and the tools of the comparative examples 1 to 12 which were produced as described above, the average composition of the A layer and the B layer, the average layer thickness $t_A$, and the average layer thickness $t_B$, were calculated, by performing the section measurement using the scanning electron microscopy (SEM), the transmission electron microscope (TEM), and the energy dispersive X-ray spectroscopy (EDS) in a visual field which was set such that the width in the direction parallel to the surface of the tool body was 10 μm and the entire thickness region of the hard coating layer was included. The compositions and the layer thicknesses of the A layer and the B layer were measured at five locations with respect to each of the layers, and these value were averaged to obtain the average composition of the A layer and the B layer, the average layer thickness $t_A$, and the average layer thickness $t_B$. Furthermore, the value of the $t_B/t_A$ was acquired.

Next, the diffraction peak intensity ratio I(200)/I(111) of the entire hard coating layer was measured using the diffraction peak intensity of the (200) plane on which the A layer and the B layer overlapped each other by the X-ray diffraction that uses a Cr tube as I(200) and was measured by using the diffraction peak intensity of the (111) plane on which the A layer and the B layer overlapped each other as I(111), the full width at half maximum of the peak of the I(200) was acquired, and the value of I(200)/I(111) was acquired.

In addition, the diffraction peak intensity of the A layer was measured by using the above-described X-ray diffraction method after processing and removing the B layer by the focused ion beam (FIB) method or the like, after the forming. Specifically, in the A layer, the diffraction peak intensity $I_A(200)$ of the (200) plane and the diffraction peak intensity $I_A(111)$ of the (111) plane were measured, the full width at half maximum of the peak of $I_A(200)$ was acquired, and the value of $I_A(200)/I_A(111)$ was acquired.

In Tables 4 and 5, various values acquired above were shown.

TABLE 4

| | | Type of tool body | A layer (Al$_{1-x}$Ti$_x$)N | | | | B layer (Al$_{1-y-z}$Ti$_y$Si$_z$)N | | | | | | Full width at half maximum of I(200) | Average total layer thickness (μm) | Crystal structure |
|---|---|---|---|---|---|---|---|---|---|---|---|---|---|---|---|
| Type | | | Value of x | Average layer thickness t$_A$ (μm) | I$_A$(200)/ I$_A$(111) | Full width at half maximum of I$_A$(200) | Value of y | Value of z | Average layer thickness t$_B$ (μm) | \|x − y\| | t$_B$/t$_A$ | I(200)/ I(111) | | | |
| Tool of present example | 1 | 1 | 0.35 | 0.5 | 7.2 | 0.7 | 0.50 | 0.07 | 1.0 | 0.15 | 2 | 5.3 | 0.6 | 1.5 | Rock salt type |
| | 2 | 2 | 0.40 | 0.5 | 6.8 | 0.6 | 0.40 | 0.05 | 2.0 | 0.00 | 4 | 9.6 | 0.7 | 2.5 | Rock salt type |
| | 3 | 3 | 0.55 | 0.5 | 10.4 | 0.3 | 0.35 | 0.10 | 1.5 | 0.20 | 3 | 10.7 | 0.5 | 2.0 | Rock salt type |
| | 4 | 1 | 0.60 | 0.5 | 5.9 | 0.5 | 0.50 | 0.03 | 1.5 | 0.10 | 3 | 8.9 | 0.3 | 2.0 | Rock salt type |
| | 5 | 2 | 0.40 | 0.8 | 3.6 | 0.8 | 0.60 | 0.01 | 3.2 | 0.20 | 4 | 3.4 | 0.8 | 4.0 | Rock salt type |
| | 6 | 3 | 0.50 | 0.5 | 6.1 | 0.5 | 0.35 | 0.05 | 2.5 | 0.15 | 5 | 7.7 | 0.9 | 3.0 | Rock salt type |
| | 7 | 1 | 0.50 | 0.7 | 4.9 | 0.6 | 0.55 | 0.02 | 2.1 | 0.05 | 3 | 6.4 | 0.6 | 2.8 | Rock salt type |
| | 8 | 2 | 0.60 | 0.3 | 1.7 | 0.9 | 0.40 | 0.08 | 1.5 | 0.20 | 5 | 3.8 | 0.7 | 1.8 | Rock salt type |
| | 9 | 3 | 0.45 | 0.4 | 7.2 | 0.2 | 0.45 | 0.04 | 1.6 | 0.00 | 4 | 9.7 | 0.3 | 2.0 | Rock salt type |
| | 10 | 1 | 0.40 | 1.0 | 3.4 | 1.1 | 0.60 | 0.03 | 2.0 | 0.20 | 2 | 5.6 | 1.0 | 3.0 | Rock salt type |

TABLE 5

| | | Type of tool body | A layer (Al$_{1-x}$Ti$_x$)N | | | | B layer (Al$_{1-y-z}$Ti$_y$Si$_z$)N | | | | | | Full width at half maximum of I(200) | Average total layer thickness (μm) | Crystal structure |
|---|---|---|---|---|---|---|---|---|---|---|---|---|---|---|---|
| Type | | | Value of x | Average layer thickness t$_A$ (μm) | I$_A$(200)/ I$_A$(111) | Full width at half maximum of I$_A$(200) | Value of y | Value of z | Average layer thickness t$_B$ (μm) | \|x − y\| | t$_B$/t$_A$ | I(200)/ I(111) | | | |
| Tool of comparative example | 1 | 1 | 0.60 | 0.2 | 6.4 | 0.5 | 0.40 | 0.10 | 1.8 | 0.20 | ※9 | ※2.4 | ※1.2 | 2.0 | Rock salt type |
| | 2 | 2 | 0.50 | 0.5 | 1.0 | 1.30 | 0.45 | 0.05 | 1.5 | 0.05 | 3 | ※1.9 | ※1.1 | 2.0 | Rock salt type |
| | 3 | 3 | 0.35 | 1.0 | 8.4 | 0.5 | 0.60 | 0.01 | 1.0 | 0.25 | ※1 | ※16.2 | ※1.3 | 2.0 | Rock salt type |
| | 4 | 1 | 0.50 | 0.5 | 11.0 | 1.0 | 0.40 | 0.07 | 2.5 | 0.10 | 5 | 10.8 | ※1.5 | 3.0 | Rock salt type |
| | 5 | 2 | 0.40 | 0.8 | 1.4 | 0.8 | 0.50 | 0.03 | 3.2 | 0.10 | 4 | ※1.7 | 0.3 | 4.0 | Rock salt type |
| | 6 | 3 | 0.40 | 1.0 | 1.9 | 0.20 | 0.55 | 0.05 | 2.0 | 0.15 | 2 | ※2.3 | 0.4 | 3.0 | Rock salt type |
| | 7 | 1 | 0.40 | 1.0 | 5.3 | 0.6 | 0.60 | 0.02 | 1.0 | 0.20 | ※1 | 4.7 | 0.8 | 2 | Rock salt type |
| | 8 | 2 | 0.60 | 0.2 | 8.4 | 0.4 | 0.45 | 0.06 | 2.0 | 0.15 | ※10 | 9.8 | 0.6 | 2.2 | Rock salt type |
| | 9 | 3 | 0.55 | 0.6 | 6.7 | 0.4 | 0.35 | 0.10 | 1.8 | 0.20 | 3 | 8.2 | ※0.2 | 2.4 | Rock salt type |
| | 10 | 1 | 0.45 | 1.0 | 9.1 | 0.30 | 0.50 | 0.04 | 2.0 | 0.05 | 2 | 5.6 | ※1.2 | 3.0 | Rock salt type |
| | 11 | 2 | 0.50 | 0.5 | 2.4 | 0.7 | 0.60 | 0.05 | 2.0 | 0.10 | 4 | ※1.3 | 0.4 | 2.5 | Rock salt type |
| | 12 | 3 | 0.50 | 0.8 | 7.7 | 0.5 | 0.50 | 0.02 | 2.4 | 0.00 | 3 | ※13.4 | 0.5 | 3.2 | Rock salt type |

(Caution) ※ indicates that the value is out of the range of the present invention.

Next, with respect to the tools of the present example 1 to 10 and the tools of comparative examples 1 to 12, cutting experiment was performed under the following cutting conditions A and B.

Cutting Condition A:
 Work material: round bar with a hole of a quenching material of JIS.SCr420
 Cutting speed: 220 m/min
 Depth of cut: 0.15 mm
 Feed: 0.15 mm Cutting Condition B:
 Work material: round bar of a quenching material of JIS.SCM415
 Cutting speed: 315 m/min
 Depth of cut: 0.1 mm
 Feed: 0.1 mm In the dry continuous cutting experiment under the cutting conditions A and B, a flank wear width was measured after cutting by 880 m of a cutting length under the condition A and by 945 m of a cutting length under the condition B.

The result thereof was shown in Table 6.

TABLE 6

| Type | | Cutting condition A | | Type | | Cutting condition B | |
|---|---|---|---|---|---|---|---|
| | | Flank wear width (mm) | Presence or absence of chipping | | | Flank wear width (mm) | Presence or absence of chipping |
| Too of present example | 1 | 0.11 | Absence | Tool of comparative example | 1 | ✗90 | Presence |
| | 2 | 0.06 | Absence | | 2 | ✗150 | Presence |
| | 3 | 0.16 | Presence | | 3 | ✗120 | Presence |
| | 4 | 0.08 | Absence | | 4 | ✗180 | Presence |
| | 5 | 0.13 | Absence | | 5 | ✗210 | Presence |
| | 6 | 0.10 | Absence | | 6 | ✗180 | Presence |
| | 7 | 0.10 | Absence | | 7 | ✗210 | Presence |
| | 8 | 0.13 | Absence | | 8 | ✗150 | Presence |
| | 9 | 0.12 | Absence | | 9 | ✗210 | Presence |
| | 10 | 0.11 | Absence | | 10 | ✗180 | Presence |
| | | | | | 11 | ✗150 | Presence |
| | | | | | 12 | ✗180 | Presence |

| Type | | Cutting condition B | | Type | | Cutting condition B | |
|---|---|---|---|---|---|---|---|
| | | Flank wear width (mm) | Presence or absence of chipping | | | Flank wear width (mm) | Presence or absence of chipping |
| Too of present example | 1 | 0.12 | Absence | Tool of comparative example | 1 | ✗60 | Presence |
| | 2 | 0.08 | Absence | | 2 | ✗120 | Absence |
| | 3 | 0.17 | Absence | | 3 | ✗60 | Presence |
| | 4 | 0.10 | Absence | | 4 | 0.24 | Absence |
| | 5 | 0.15 | Absence | | 5 | 0.21 | Absence |
| | 6 | 0.13 | Absence | | 6 | ✗150 | Absence |
| | 7 | 0.12 | Absence | | 7 | 0.23 | Absence |
| | 8 | 0.16 | Absence | | 8 | ✗120 | Presence |
| | 9 | 0.14 | Absence | | 9 | ✗150 | Presence |
| | 10 | 0.15 | Absence | | 10 | ✗90 | Presence |
| | | | | | 11 | ✗150 | Presence |
| | | | | | 12 | 0.24 | Absence |

✗ indicates cutting service life (sec) that reached the end of service life before reaching the maximum cutting length.

"Presence or absence of chipping" shown in Table 6 was the result of confirming the presence or absence of chipping by observing wearing surfaces of the tools of the present example 1 to 10 and the tools of comparative examples 1 to 12 after performing the dry continuous cutting experiment under the cutting conditions A and B using the SEM.

"Flank wear width" shown in Table 6 was the result of measuring the wear width from the length on the SEM photo by observing the flank faces of the tools of the present example 1 to 10 and the tools of comparative examples 1 to 12 after performing the dry continuous cutting experiment under the cutting conditions A and B using the SEM. When the flank wear width exceeded 0.2 mm, the cutting performance, such as cutting accuracy, deteriorated. When the flank wear width exceeded 0.25 mm, the tool was determined as the tool reaching the end of service life.

According to the result of Table 6, in the tool of the present examples 1 and 2 and 4 to 10, it was possible to perform the cutting without chipping, and further, the wear resistance was also excellent, since an average of the flank wear width was approximately 0.11 mm under the cutting condition A and approximately 0.13 mm under the cutting condition B. In the tool of the present example 3, occurrence of chipping was observed, but the flank wear width was 0.2 mm or less, and the wear resistance was confirmed.

In the tools of comparative examples 1 to 12, it was apparent that span of the end of service life was a short period of time by the occurrence of chipping or progress of flank wear.

From the result, it was ascertained that the tools of the present example were excellent in any of the chipping resistance and the wear resistance compared to the tools of comparative examples.

INDUSTRIAL APPLICABILITY

Since the surface-coated cutting tool of the present invention achieves excellent chipping resistance and the wear resistance and excellent cutting performance over a long period of time not only in the cutting process under a general cutting condition of various types of steel, but also in a high-speed cutting process of alloy steel that applies a large load to the cutting edge portion, particularly with high heat generation, it is possible to sufficiently satisfy high performance of the cutting processing device, labor saving and energy saving of the cutting process, and further, low costs.

REFERENCE SIGNS LIST 11 cBN BODY, TOOL BODY
12 A LAYER: (Al,Ti)N
13 B LAYER: (Al,Ti,Si)N
20 ARC ION PLATING DEVICE
21 ANODE ELECTRODE
22 Al—Ti ALLOY TARGET (VAPOR SOURCE), CATHODE ELECTRODE
23 ROTARY TABLE
24 HEATER
25 ARC ELECTRODE

26 BIAS ELECTRODE
31 REACTANT GAS INTRODUCTION PORT
32 EXHAUST GAS PORT

The invention claimed is:

1. A surface-coated cutting tool comprising:
a tool body in which at least a cutting edge is made of a cubic boron nitride sintered body; and
a hard coating layer which is deposited on the tool body, wherein,
(a) the cubic boron nitride sintered body is made of cubic boron nitride particles, and a bonded phase which includes at least one or more components selected from a group consisting of nitride, carbide, carbonitride and boride of Ti and nitride and oxide of Al, and inevitable impurities,
(b) an average grain size of the cubic boron nitride particles is 0.5 to 4.0 μm, a volume ratio of the cubic boron nitride particles in total volume of the cubic boron nitride sintered body is 40 to 70% by volume, and further, an average grain size of the bonded phase is 1 μm or less,
(c) the hard coating layer consists of an A layer that coats a surface of the tool body and a B layer that coats a surface of the A layer,
(d) the A layer satisfies $0.35 \leq x \leq 0.6$ by an atom ratio in a case where compositional formula is $(Al_{1-x}Ti_x)N$, and the B layer satisfies $0.35 \leq y \leq 0.6$ and $0.01 \leq z \leq 0.1$ by an atom ratio in a case where compositional formula is $(Al_{1-y-z}Ti_ySi_z)N$,
(e) an average total layer thickness of the A layer and the B layer is 1.5 to 4.0 μm, and satisfies $2 \leq t_B/t_A \leq 5$ in a case where an average layer thickness of the A layer is $t_A$ and an average layer thickness of the B layer is $t_B$, and
(f) in a case where X-ray diffraction is performed on the entire hard coating layer consisting of the A layer and the B layer, the entire hard coating layer has a rock salt type cubic crystal structure, and $3 < I(200)/I(111) \leq 12$ is satisfied when a diffraction peak intensity of a (200) plane of crystal grains that configure the hard coating layer is I(200) and a diffraction peak intensity of a (111) plane of crystal grains that configure the hard coating layer is I(111), and a full width at half maximum of a peak of I(200) is 0.3 to 1.0.

2. The surface-coated cutting tool according to claim 1, wherein x which indicates a Ti content ratio of the A layer and y which indicates a Ti content ratio of the B layer satisfy a relationship of $|x-y| \leq 0.15$.

3. The surface-coated cutting tool according to claim 1, wherein, in a case where the X-ray diffraction is performed on the A layer, when the diffraction peak intensity of the (200) plane is $I_A(200)$ and the diffraction peak intensity of the (111) plane is $I_A(111)$, $2 < I_A(200)/I_A(111) \leq 10$ is satisfied, and a full width at half maximum of a peak of $I_A(200)$ is 0.3 to 1.0.

4. The surface-coated cutting tool according to claim 2, wherein, in a case where the X-ray diffraction is performed on the A layer, when the diffraction peak intensity of the (200) plane is $I_A(200)$ and the diffraction peak intensity of the (111) plane is $I_A(111)$, $2 < I_A(200)/I_A(111) \leq 10$ is satisfied, and a full width at half maximum of a peak of $I_A(200)$ is 0.3 to 1.0.

* * * * *